(12) United States Patent
Chida et al.

(10) Patent No.: US 7,400,485 B2
(45) Date of Patent: *Jul. 15, 2008

(54) SURGE ABSORBER

(75) Inventors: Naoki Chida, Tokyo (JP); Yuji Terada, Tokyo (JP); Koichi Ishii, Tokyo (JP); Takeshi Yanata, Tokyo (JP); Dai Matsuoka, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/502,371

(22) Filed: Aug. 11, 2006

(65) Prior Publication Data

US 2007/0070569 A1   Mar. 29, 2007

(30) Foreign Application Priority Data

Sep. 28, 2005   (JP)   ............................ P2005-282846
Sep. 28, 2005   (JP)   ............................ P2005-282854

(51) Int. Cl.
      *H02H 1/00*   (2006.01)
(52) U.S. Cl. .................... 361/117; 361/56; 361/117; 361/119; 361/127
(58) Field of Classification Search ................ 361/56, 361/119, 117, 127
      See application file for complete search history.

(56) References Cited

U.S. PATENT DOCUMENTS

| 3,566,201 | A | * | 2/1971 | Eugene | 361/134 |
| 3,772,748 | A | * | 11/1973 | Rutt | 29/25.42 |
| 4,809,124 | A | * | 2/1989 | Kresge | 361/58 |
| 5,034,709 | A | * | 7/1991 | Azumi et al. | 333/184 |
| 5,159,300 | A | * | 10/1992 | Nakamura et al. | 333/184 |
| 5,200,875 | A | * | 4/1993 | Yoshioka et al. | 361/56 |
| 7,085,118 | B2 | * | 8/2006 | Inoue et al. | 361/119 |
| 2006/0038635 | A1 | * | 2/2006 | Richiuso et al. | 333/177 |
| 2006/0227473 | A1 | * | 10/2006 | Inoue et al. | 361/56 |

FOREIGN PATENT DOCUMENTS

| JP | A-01-162312 | 6/1989 |
| JP | 403274815 | * 3/1990 |
| JP | A-4-103013 | 9/1992 |
| JP | A-4-257112 | 9/1992 |
| JP | 05-190315 | 7/1993 |

(Continued)

*Primary Examiner*—Michael J Sherry
*Assistant Examiner*—Tien Mai
(74) *Attorney, Agent, or Firm*—Oliff & Berridge, PLC

(57) ABSTRACT

A surge absorber has a first terminal electrode, a second terminal electrode, a third terminal electrode, an inductor portion, a surge absorbing portion, and a resistor portion. The inductor portion has a first internal conductor and a second internal conductor mutually coupled in a polarity-reversed relation. One end of the first internal conductor is connected to the first terminal electrode. One end of the second internal conductor is connected to the second terminal electrode. The other end of the first internal conductor is connected to the other end of the second internal conductor. The surge absorbing portion has a first internal electrode and a second internal electrode. The first internal electrode is connected to the other end of the first internal conductor and to the other end of the second internal conductor. The second internal electrode is connected to the third terminal electrode. The resistor portion has a DC resistance component connected between the first terminal electrode and the second terminal electrode.

12 Claims, 11 Drawing Sheets

FOREIGN PATENT DOCUMENTS

| | | |
|---|---|---|
| JP | A-07-045477 | 2/1995 |
| JP | A-08-250309 | 9/1996 |
| JP | A-10-335115 | 12/1998 |
| JP | A-2000-124022 | 4/2000 |
| JP | A-2001-060838 | 3/2001 |
| JP | A-2001-160728 | 6/2001 |
| JP | A-2005-260343 | 9/2005 |

* cited by examiner

SURGE ABSORBER

BACKGROUND OF THE INVENTION

1. Field of the Invention

The present invention relates to a surge absorber.

2. Related Background Art

Semiconductor devices such as ICs and LSIs can be broken or deteriorated in characteristics by static electricity of high voltage. For this reason, the semiconductor devices are constructed using a surge absorber, such as a varistor, as a countermeasure against static electricity.

Incidentally, the surge absorbers including the varistors have a stray capacitance component and a stray inductance component. Therefore, if a surge absorber is applied to a circuit handling high-speed signals, it will deteriorate the high-speed signals. The stray capacitance component of the surge absorber must be kept small for applying the surge absorber to the circuit handling high-speed signals; otherwise, deterioration will inevitably occur in rising characteristics and delay characteristics of the high-speed signals. However, decrease of the stray capacitance component of the surge absorber will result in increase of control voltage of the surge absorber and decrease of energy resistance of the surge absorber.

A surge absorber provided with an inductor and two varistors is known as a surge absorber for alleviating the influence of the stray capacitance component (e.g., Japanese Patent Application Laid-Open No. 2001-60838). The surge absorber described in the Laid-Open No. 2001-60838 has a parallel circuit consisting of the first varistor and the inductor, the second varistor electrically connected in series to the parallel circuit, and input/output electrodes and a ground electrode connected to the two ends of the series circuit consisting of the second varistor and the parallel circuit.

SUMMARY OF THE INVENTION

In the surge absorber described in the Laid-Open No. 2001-60838, however, a band-pass filter is constructed of the stray capacitance of the first varistor and the inductor, and it is thus difficult to effect impedance matching over a wide band. Therefore, it is infeasible to achieve sufficient characteristics for high-speed signals.

An object of the present invention is to provide a surge absorber with excellent impedance matching for high-speed signals as well.

A surge absorber according to the present invention is a surge absorber comprising: a first terminal electrode; a second terminal electrode; a third terminal electrode; an inductor portion having a first internal conductor and a second internal conductor mutually coupled in a polarity-reversed relation, wherein one end of the first internal conductor is connected to the first terminal electrode, one end of the second internal conductor is connected to the second terminal electrode, and an other end of the first internal conductor is connected to an other end of the second internal conductor; a surge absorbing portion having a first internal electrode connected to the other end of the first internal conductor and to the other end of the second internal conductor, and a second internal electrode connected to the third terminal electrode; and a resistor portion having a DC resistance component connected between the first terminal electrode and the second terminal electrode.

In the surge absorber according to the present invention, the inductor portion has the first internal conductor and the second internal conductor mutually coupled in the polarity-reversed relation. For this reason, the influence of the stray capacitance component can be canceled by properly setting the inductance of the inductor portion relative to the stray capacitance component of the surge absorbing portion. As a result, the input impedance with a flat frequency characteristic can be realized over a wide band.

The surge absorber according to the present invention further comprises the resistor portion having the DC resistance component. This makes the impedance of the surge absorber relatively large. For this reason, the surge absorber has the impedance relatively higher than that of an element to be protected, such as an IC or LSI, for high-frequency components of an electrostatic pulse which is generated, for example, upon contact between a human body and a terminal of electronic equipment. This results in preventing the electrostatic pulse from flowing through the element to be protected, so that the electrostatic pulse can be effectively guided to the surge absorbing portion, so as to enhance the ESD (Electrostatic Discharge) protection level by the surge absorber.

Preferably, the DC resistance component of the resistor portion is set in the range of 0Ω to 7.5Ω inclusive.

Incidentally, the differential transmission method is one of methods for transmitting digital signals between electronic devices. The differential transmission method is a method of feeding mutually opposite digital signals through a pair of lines and the differential transmission can cancel out radiated noise generated from the signal lines, and external noise. Since the external noise is canceled out, the differential transmission method can decrease the noise and transmit signals in small amplitude. Because of the small amplitude of signals, the differential transmission method has the advantage of decrease in rise and fall times of signals to realize increase in speed of signal transmission.

The interface standards for the differential transmission method include USB (Universal Serial Bus), IEEE1394, LDVS (Low Voltage Differential Signaling), DVI (Digital Video Interface), HDMI (High-Definition Multimedia Interface), and so on. Among these, HDMI is an interface enabling transmission of more digital signals, and fast interface enabling transmission of uncompressed digital signals between a source device (e.g., a DVD player, a set-top box, or the like) and a sink device (e.g., a digital television, a projector, or the like). The HDMI enables fast transmission of video signals and voice signals through one cable.

In the fast interfaces such as the HDMI, the structure of an IC itself is becoming weaker against ESD in order to substantialize increase of speed. For this reason, there are increasing demands for ESD countermeasures in the fast transmission type IC.

It was, however, newly found that when a surge absorber as an ESD countermeasure was inserted in a transmission line, it reflected and attenuated signals transmitted through the transmission line, particularly, high-frequency signals (over 200 MHz) and high-speed pulse signals. This is caused for the following reason: when the surge absorber is inserted in the transmission line, the capacitance component of the surge absorber decreases the characteristic impedance at the position where the surge absorber is inserted in the transmission line, so at to cause impedance mismatch there. When the transmission line includes the impedance-mismatched portion, high-frequency components of signals are reflected at the characteristic impedance-mismatched portion to cause return loss. This results in heavily attenuating the signals. The reflection induces unwanted radiation in the transmission line and it could cause noise. In the case of the HDMI, the rated value (TDR standard) of the characteristic impedance of transmission lines is defined as 100Ω±15% (High-Definition Multimedia Interface Specification Version 1.1).

It is seen from the above discussion that impedance matching can be achieved if the characteristic impedance of one line is within the range of 50±7.5Ω, in the differential transmission method of feeding mutually opposite digital signals through a pair of lines. Therefore, when the DC resistance component of the resistor portion is set in the range of 0Ω to 7.5Ω inclusive, the impedance matching can be achieved even in the case where the surge absorber is inserted in the transmission lines in the differential transmission method such as the HDMI.

Preferably, the DC resistance component of the resistor portion is constructed of the first internal conductor and the second internal conductor. In this case, there is no need for provision of a separate resistor or the like for construction of the resistor portion, and it is thus feasible to simplify the configuration of the surge absorber and to achieve downsizing of the surge absorber.

Preferably, a combined DC resistance component of a DC resistance component of the first internal conductor and a DC resistance component of the second internal conductor is set in the range of 0Ω to 7.5Ω inclusive. In this case, the impedance matching can be achieved even in the case where the surge absorber is inserted in the transmission lines in the differential transmission method such as the HDMI, as described above.

Preferably, the surge absorber further comprises a capacitor portion having a capacitance component connected between the first terminal electrode and the second terminal electrode. This permits us to flexibly set the inductance of the inductor portion and the capacitance of the capacitance component of the capacitor portion with respect to the stray capacitance component of the surge absorbing portion.

Preferably, the capacitance component of the capacitor portion is constructed of the first internal conductor and the second internal conductor. In this: case, there is no need for provision of separate internal electrodes or the like for construction of the capacitor portion. Therefore, it is feasible to simplify the configuration of the absorber and to achieve downsizing of the absorber.

Preferably, the inductor portion is comprised of a lamination of an inductor layer on which the first internal conductor is formed, and an inductor layer on which the second internal conductor is formed; the surge absorbing portion is comprised of a lamination of a varistor layer on which the first internal electrode is formed, and a varistor layer on which the second internal electrode is formed; the first internal conductor and the second internal conductor include mutually overlapping regions when viewed from a laminate direction of the inductor layers; and the first internal electrode and the second internal electrode include mutually overlapping regions when viewed from a laminate direction of the varistor layers. In this case, capacitance coupling occurs between the mutually overlapping regions, when viewed from the laminate direction of the inductor layers, in the first internal conductor and the second internal conductor, whereby these regions form the aforementioned capacitance component. This eliminates the need for provision of separate internal electrodes or the like for construction of the capacitor portion, and it is thus feasible to simplify the configuration of the absorber and to achieve downsizing of the absorber. The surge absorbing portion can be constructed of a varistor.

More preferably, each of the varistor layers contains ZnO as a principal component and contains at least one element selected from the group consisting of rare earths and Bi, and Co as additives, and each of the inductor layers contains ZnO as a principal component and substantially does not contain Co. In this case, the element bodies of the varistor layers and the inductor layers contain the same material (ZnO) as a principal component. Therefore, even in the case where they are integrally sintered, stress or the like is unlikely to occur based on a difference of volume changes of the element bodies during sintering between the two kinds of layers. This significantly reduces delamination between the surge absorbing portion and the inductor portion. The material making the inductor layers, i.e., the material containing ZnO as a principal component and substantially not containing Co has characteristics of an extremely high resistivity and a low permittivity, as compared with ZnO itself or the constituent material of the varistor layers (containing a rare earth or Bi, and Co in addition to ZnO). Therefore, the inductor layers containing such a material have excellent inductor characteristics.

Preferably, the first terminal electrode, the second terminal electrode, and the third terminal electrode are formed on an external surface of an element body including the inductor portion, the surge absorbing portion, and the resistor portion, and the other end of the first internal conductor, the other end of the second internal conductor, and the first internal electrode are connected through an external conductor formed on the external surface of the element body. In this case, it is feasible to readily and securely connect the other end of the first internal conductor, the other end of the second internal conductor, and the first internal electrode.

Preferably, the first terminal electrode is an input terminal electrode, the second terminal electrode is an output terminal electrode, and the first internal conductor and the second internal conductor are positively coupled.

Preferably, the surge absorber comprises two or more of each of the first terminal electrode, the second terminal electrode, the third terminal electrode, the first internal conductor, the second internal conductor, the first internal electrode, and the second internal electrode. In this case, it is feasible to realize the surge absorber in an array form.

Preferably, the resistor portion has a first DC resistance component connected between the first terminal electrode and the first internal electrode, and a second DC resistance component being larger than the first DC resistance component and connected between the first internal electrode and the second terminal electrode. In this case, the surge absorber, particularly, the circuit portion between the surge absorbing portion and the second terminal electrode comes to have a relatively large impedance. For this reason, the circuit portion between the surge absorbing portion and the second terminal electrode has the impedance relatively higher than an element to be protected, such as an IC or LSI, for high-frequency components of an electrostatic pulse generated, for example, upon contact between a human body and a terminal of electronic equipment. In consequence, when the element to be protected is connected to the second terminal electrode, the electrostatic pulse is prevented from flowing through the element to be protected, and can be effectively guided to the surge absorbing portion, so as to enhance the ESD protection level by the surge absorber.

Preferably, a combined DC resistance component of the first DC resistance component and the second DC resistance component is set in the range of 0Ω to 7.5Ω inclusive. In this case, impedance matching can be achieved even in the case where the surge absorber is inserted in the transmission lines in the differential transmission method such as the HDMI, as described above.

Preferably, the first DC resistance component is constructed of the first internal conductor and the second DC resistance component is constructed of the second internal conductor. In this case, there is no need for provision of a separate resistor or the like for construction of the resistor portion, and it is thus feasible to simplify the configuration of the surge absorber and to achieve downsizing of the surge absorber.

Preferably, a combined DC resistance component of a DC resistance component of the first internal conductor and a DC resistance component of the second internal conductor is set in the range of 0Ω to 7.5Ω inclusive. In this case, impedance matching can be achieved even in the case where the surge absorber is inserted in the transmission lines in the differential transmission method such as the HDMI, as described above.

The present invention successfully provides the surge absorber with excellent impedance matching for high-speed signals as well.

The present invention successfully enhances the ESD protection level by the surge absorber.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

The preferred embodiments of the present invention will be described below in detail with reference to the accompanying drawings. In the description the same elements or elements with the same functionality will be denoted by the same reference symbols, without redundant description.

First Embodiment

Figure 1:
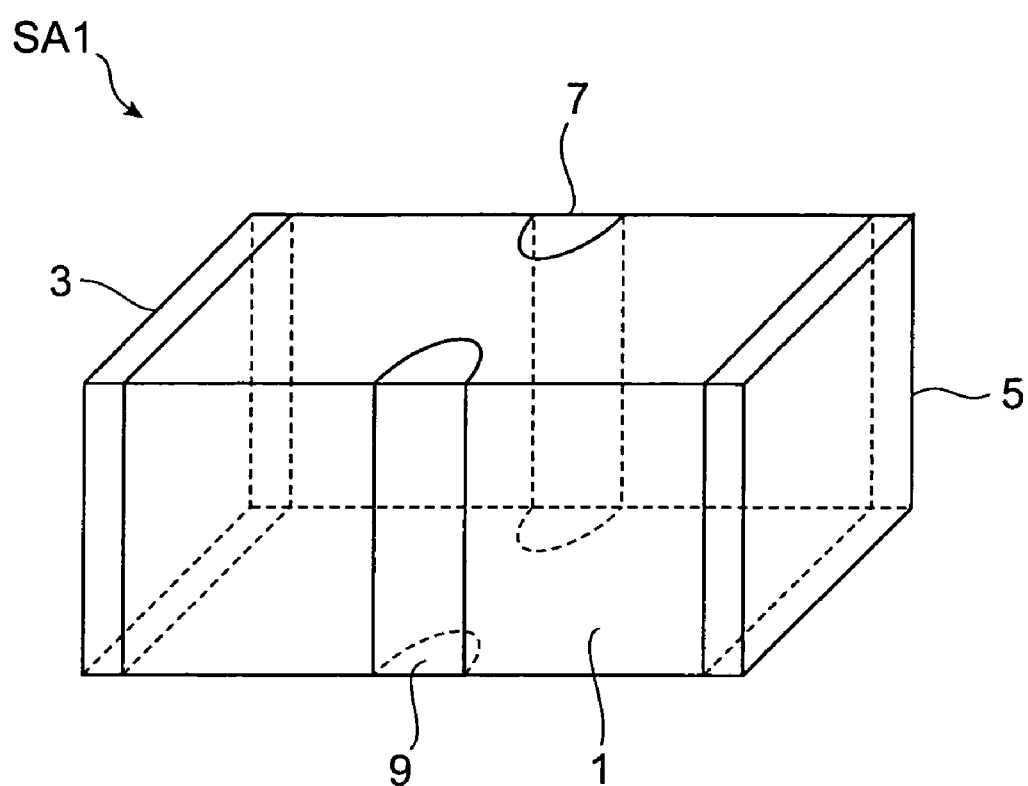
FIG. 1 is a schematic perspective view showing a surge absorber according to the first embodiment.
Figure 2:
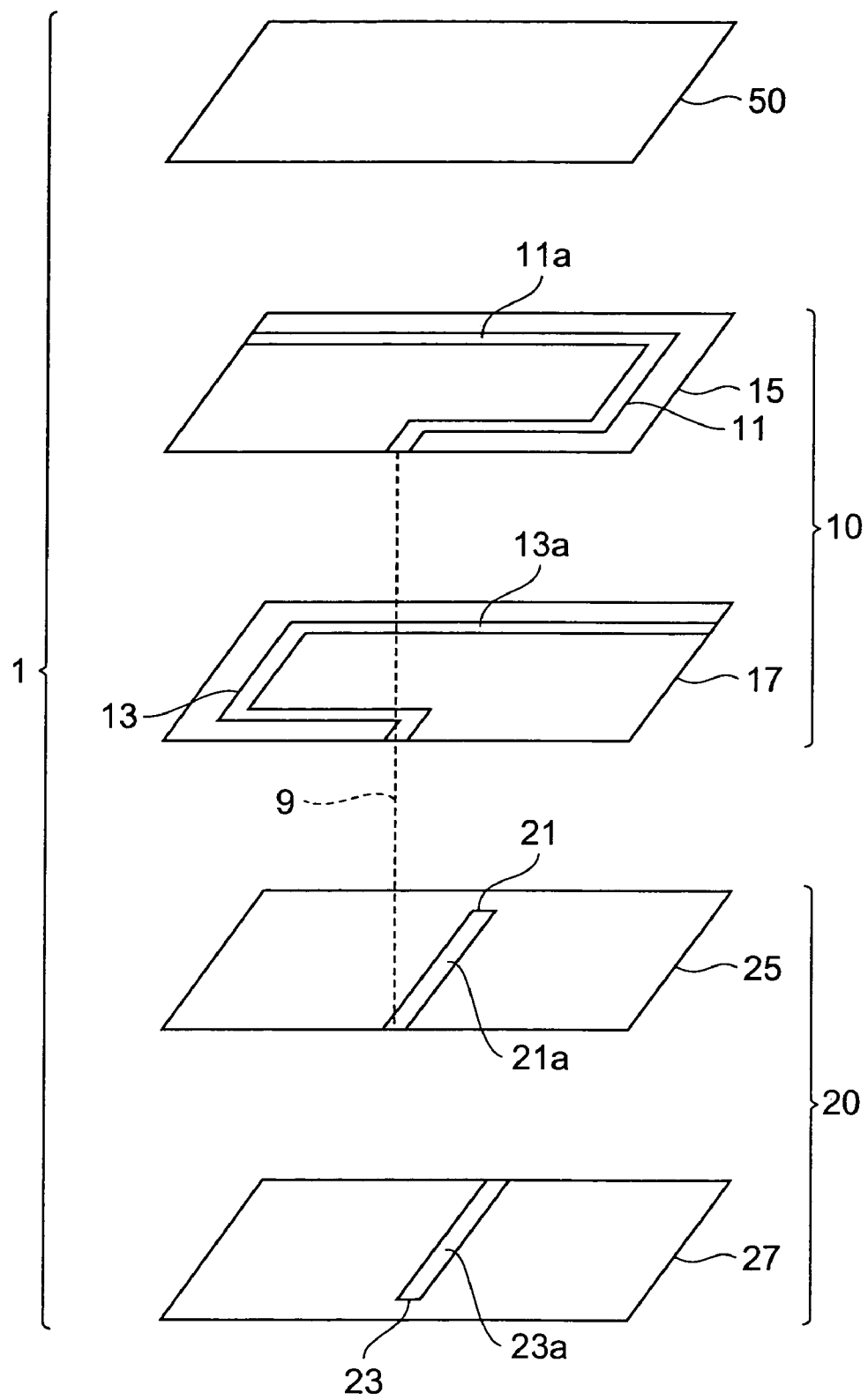
FIG. 2 is an exploded perspective view for explaining a configuration of an element body included in the surge absorber according to the first embodiment.

First, a configuration of surge absorber SA1 according to the first embodiment will be described based on FIGS. 1 and 2. FIG. 1 is a schematic perspective view showing the surge absorber according to the first embodiment. FIG. 2 is an exploded perspective view for explaining a configuration of an element body included in the surge absorber according to the first embodiment.

The surge absorber SA1, as shown in FIG. 1, has an element body 1, a first terminal electrode 3, a second terminal electrode 5, a third terminal electrode 7, and an external conductor 9. The element body 1 is of rectangular parallelepiped shape and is set, for example, to the length of about 1 mm, the width of about 0.5 mm, and the height of about 0.3 mm. The first terminal electrode 3 and the second terminal electrode 5 are formed at the longitudinal ends of the element body 1. The third terminal electrode 7 and the external conductor 9 are formed so as to face each other on respective side faces of the element body 1. The first terminal electrode 3 functions as an input terminal electrode of the surge absorber SA1. The second terminal electrode 5 functions as an output terminal electrode of the surge absorber SA1. The third terminal electrode 7 functions as a ground terminal electrode of the surge absorber SA1.

The element body 1, as shown in FIG. 2, has an inductor portion 10 and a surge absorbing portion 20. The element body 1 is constructed in a structure in which the surge absorbing portion 20, the inductor portion 10, and a protecting layer 50 are laminated in order from bottom in the drawing.

The inductor portion 10 has a first internal conductor 11 and a second internal conductor 13 mutually coupled in a polarity-reversed relation. The inductor portion 10 is comprised of a lamination of an inductor layer 15 on which the first internal conductor 11 is formed, and an inductor layer 17 on which the second internal conductor 13 is formed.

One end of the first internal conductor 11 is led to an edge of the inductor layer 15 so as to be exposed in one end face of the element body 1 (the end face on which the first terminal electrode 3 is formed). The one end of the first internal conductor 11 is physically and electrically connected to the first terminal electrode 3. One end of the second internal conductor 13 is led to an edge of the inductor layer 17 so as to be exposed in the other end face of the element body 1 (the end face on which the second terminal electrode 5 is formed). The one end of the second internal conductor 13 is physically and electrically connected to the second terminal electrode 5. Each of the other end of the first internal conductor 11 and the other end of the second internal conductor 13 is led to an edge of the inductor layer 15 or 17, respectively, so as to be exposed in the same side face of the element body 1 (the side face on which the external conductor 9 is formed). The other end of the first internal conductor 11 and the other end of the second internal conductor 13 are physically and electrically connected to the external conductor 9 formed on the side face of the element body 1. The other end of the first internal conductor 11 and the other end of the second internal conductor 13 are electrically connected through the external conductor 9 to each other.

The first internal conductor 11 and the second internal conductor 13 include mutually overlapping regions 11a, 13a, respectively, when viewed from the laminate direction of the inductor layers 15, 17. The first internal conductor 11 and the second internal conductor 13 are capacitance-coupled in the regions 11a, 13a. The first internal conductor 11 and the second internal conductor 13 may also be connected through a through-hole conductor or the like arranged inside the element body 1, instead of the external conductor 9 described above. There are no particular restrictions on an electrically conductive material contained in the first internal conductor 11 and the second internal conductor 13, but the electrically conductive material is preferably Pd, or Ag—Pd alloy.

Each of the inductor layers 15, 17 is made of a ceramic material containing ZnO as a principal component. In addition to ZnO, the ceramic material making the inductor layers 15, 17 may further contain a rare earth (e.g., Pr), and such metal elements as K, Na, Cs, and Rb, as additives. Among others, a particularly preferred additive is a rare earth. The addition of the rare earth facilitates reduction in the difference of volume changes between the inductor layers 15, 17 and after-described varistor layers 25, 27. The inductor layers 15, 17 may further contain Cr, Ca, and/or Si, for the purpose of enhancing the bonding performance to the after-described surge absorbing portion 20. These metal elements contained in the inductor layers 15, 17 can exist in various forms such as single metal and oxides. A preferred content of the additives in the inductor layers 15, 17 is preferably not less than 0.02 mol % nor more than 2 mol %, based on the total amount of ZnO in the inductor layers 15, 17. The contents of these metal elements can be measured, for example, with an inductively coupled radio frequency plasma emission spectral analyzer (ICP).

Each of the inductor layers 15, 17 substantially does not contain Co, whereas the after-described varistor layers 25, 27 contain Co. Here the state in which "a layer substantially does not contain an element" refers to a state of a case where the element is not intentionally contained as a raw material for forming the inductor layers 15, 17. For example, a case where the element is unintentionally contained because of diffusion or the like from the surge absorbing portion 20 into the inductor portion 10 corresponds to the state in which "a layer substantially does not contain an element." The inductor layers 15, 17 may further contain another metal element or the like for the purpose of further enhancing the characteristics or the like as long as the above condition is met.

The surge absorbing portion 20 has a first internal electrode 21 and a second internal electrode 23. The surge absorbing portion 20 is comprised of a lamination of a varistor layer 25 on which the first internal electrode 21 is formed, and a varistor layer 27 on which the second internal electrode 23 is formed.

The first internal electrode 21 has a pattern of straight line shape and extends along the transverse direction of the varistor layer 25. One end of the first internal electrode 21 is led to an edge of the varistor layer 25 so as to be exposed in the side face of the element body 1 (the side face on which the external conductor 9 is formed). The other end of the first internal electrode 21 is not exposed in any side face of the element body 1 (the side face on which the third terminal electrode 7 is formed) and is located inside the side face. The one end of the first internal electrode 21 is physically and electrically connected to the external conductor 9 formed on the side face of the element body 1. The other end of the first internal conductor 11, the other end of the second internal conductor 13, and the one end of the first internal electrode 21 are electrically connected through the external conductor 9 to each other.

The second internal electrode 23 has a pattern of straight line shape and extends along the transverse direction of the varistor layer 27. One end of the second internal electrode 23 is led to an edge of the varistor layer 27 so as to be exposed in the side face of the element body 1 (the side face on which the third terminal electrode 7 is formed). The other end of the second internal electrode 23 is not exposed in any side face of the element body 1 (the side face on which the external conductor 9 is formed) and is located inside the side face. The one end of the second internal electrode 23 is physically and electrically connected to the third terminal electrode 7 formed on the side face of the element body 1.

The first internal electrode 21 and the second internal electrode 23 include mutually overlapping regions 21a, 23a, respectively, when viewed from the laminate direction of the varistor layers 25, 27. Therefore, the regions 21a, 23a overlapping with the first internal electrode 21 and the second internal electrode 23 in the varistor layers 25, 27 function as regions to develop the varistor characteristics (nonlinear voltage-current characteristics). There are no particular restrictions on an electrically conductive material contained in the first internal electrode 21 and the second internal electrode 23, but the electrically conductive material is preferably Pd, or Ag—Pd alloy.

Each of the varistor layers 25, 27 is made of a ceramic material containing ZnO as a principal component. This ceramic material further contains at least one element selected from the group consisting of rare earths and Bi, and Co as additives. In the present embodiment the varistor layers 25, 27 contain Co in addition to a rare earth, and thus have excellent nonlinear voltage-current characteristics and a high permittivity ($\in$). Conversely, since the aforementioned inductor layers 15, 17 do not contain Co, they have no varistor characteristics and have a small permittivity and high resistivity. For this reason, the inductor layers 15, 17 have extremely appropriate characteristics as components of the inductor portion 10. The ceramic material making the varistor layers 25, 27 may further contain Al as an additive. When the ceramic material contains Al, the varistor layers 25, 27 have a low resistance. The rare earth contained as an additive is preferably Pr.

The metal elements as these additives can exist in forms such as single metal and oxides in the varistor layers 25, 27. The varistor layers 25, 27 may further contain other metal elements or the like (e.g., Cr, Ca, Si, K, and so on) than the above-described elements as additives.

The first internal conductor 11 has a first DC resistance component. The first DC resistance component is interposed between the first terminal electrode 3 and the first internal electrode 21. Namely, the first DC resistance component is connected between the first terminal electrode 3 and the first internal electrode 21; one end thereof is electrically connected to the first terminal electrode 3 while the other end thereof is electrically connected to the first internal electrode 21.

The second internal conductor 13 has a second DC resistance component. The second DC resistance component is interposed between the first internal electrode 21 and the second terminal electrode 5. Namely, the second DC resistance component is connected between the first internal electrode 21 and the second terminal electrode 5; one end thereof is electrically connected to the first internal electrode 21 while the other end thereof is electrically connected to the second terminal electrode 5.

The second DC resistance component of the second internal conductor 13 is set to be larger than the first DC resistance component of the first internal conductor 11. A combined DC resistance component of the first DC resistance component and the second DC resistance component is set in the range of 0Ω to 7.5Ω inclusive. In the present embodiment, the first DC resistance component of the first internal conductor 11 is set to about 0.5Ω, and the second DC resistance component of the second internal conductor 13 to about 4.5Ω. Therefore, the combined DC resistance component of the first DC resistance component and the second DC resistance component is about 5Ω.

The protecting layer 50 is a layer made of a ceramic material, and protects the inductor portion 10. There are no particular restrictions on the constituent material of the protecting layer 50, and a variety of ceramic materials or the like can be applied. The constituent material is preferably a material containing ZnO as a principal component, in terms of reduction in delamination from the laminated structure described above.

The first terminal electrode 3, second terminal electrode 5, third terminal electrode 7, and external conductor 9 are preferably made of a metal material that can be electrically connected well to the metal such as Pd forming the internal conductors 11, 13 and the internal electrodes 21, 23. For example, Ag is suitably applicable as a material for the external electrodes because it demonstrates good electrical connection to the internal conductors 11, 13 and the internal electrodes 21, 23 of Pd and good adhesiveness to the end face of the element body 1.

An Ni-plated layer (not shown) and an Sn-plated layer (not shown), or the like are formed in order on the surfaces of the first terminal electrode 3, second terminal electrode 5, third terminal electrode 7, and external conductor 9. These plated layers are formed for the purpose of enhancing solder heat resistance and solder wettability, mainly, on the occasion of mounting the surge absorber SA1 on a substrate or the like by solder reflow.

Figure 3:
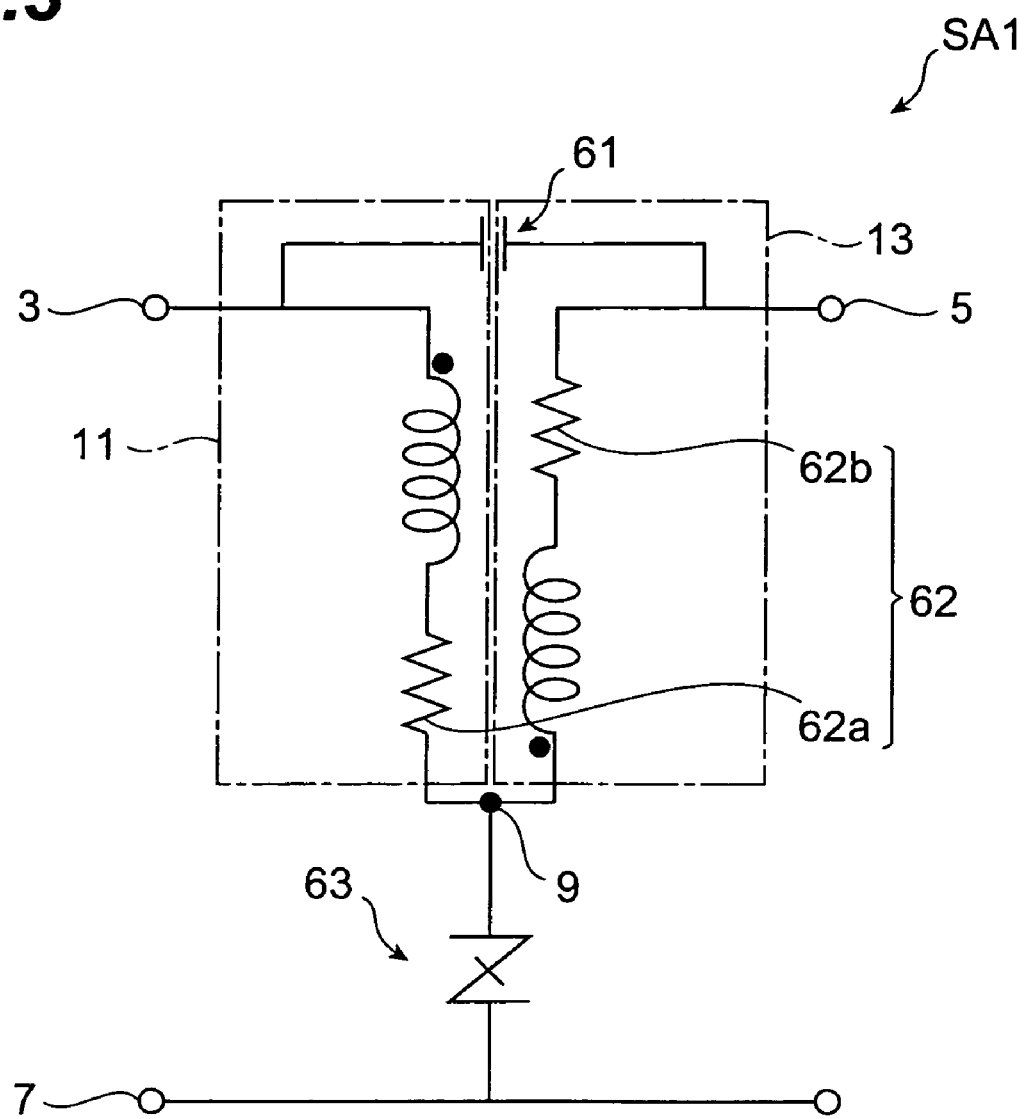
FIG. 3 is a diagram for explaining a circuit configuration of the surge absorber according to the first embodiment.
Figure 4:
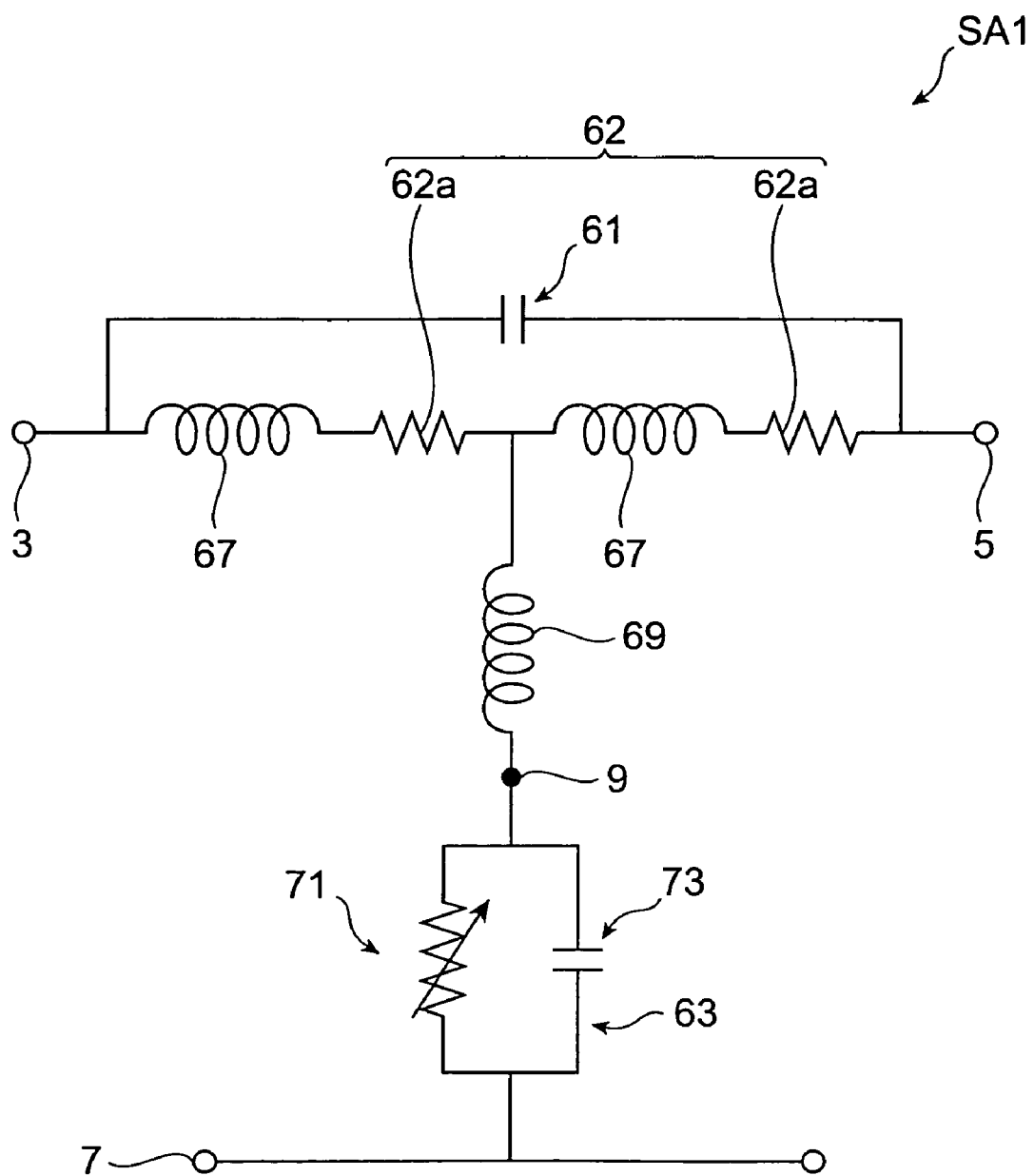
FIG. 4 is a diagram showing an equivalent circuit to the circuit configuration shown in FIG. 3.

Next, a circuit configuration of the surge absorber SA1 having the above-described configuration will be described based on FIGS. 3 and 4. FIG. 3 is a diagram for explaining the circuit configuration of the surge absorber according to the first embodiment. FIG. 4 is a diagram showing an equivalent circuit to the circuit configuration shown in FIG. 3.

The first internal conductor 11 and the second internal conductor 13 include the mutually overlapping regions 11a, 13a, respectively, when viewed from the laminate direction of the inductor layers 15, 17, as described above, and are capacitance-coupled in the regions 11a, 13a. For this reason, the surge absorber SA1 has a capacitance component 61 formed by the first internal conductor 11 and the second internal conductor 13, as shown in FIG. 3. The capacitance component 61 is connected between the first terminal electrode 3 and the second terminal electrode 5.

The first internal conductor 11 has an inductance component and a first DC resistance component 62a connected in series. The second internal conductor 13 has an inductance component and a second DC resistance component 62b connected in series. Therefore, the surge absorber SA1, as shown in FIG. 3, has a DC resistance component 62 (combined resistance component of the first DC resistance component 62a and the second DC resistance component 62b) constructed of the first internal conductor 11 and the second internal conductor 13. The DC resistance component 62 is electrically connected between the first terminal electrode 3 and the second terminal electrode 5. The second DC resistance component 62b is larger than the first DC resistance component 62a, as described above.

Here the state of being "coupled in a polarity-reversed relation" means, as shown in FIG. 3, that in a case where the winding start of the inductance component corresponding to the first internal conductor 11 is on the first terminal electrode 3 side and where the winding start of the inductance component corresponding to the second internal conductor 13 is on the connected side to the first internal conductor 11 (the external conductor 9 side in the present embodiment), the coupling between the first internal conductor 11 and the second internal conductor 13 is "positive." Namely, the state of being "coupled in a polarity-reversed relation" means that an electric current flows from the first terminal electrode 3 side into the first internal conductor 11, an electric current flows from the connected side to the first internal conductor 11 (the external conductor 9 side in the present embodiment) into the second internal conductor 13, and a magnetic flux produced in the first internal conductor 11 and a magnetic flux produced in the second internal conductor 13 reinforce each other.

In the surge absorber SA1, one varistor 63 is constructed of the first internal electrode 21, the second internal electrode 23, and the regions 21a, 23a overlapping with the first internal electrode 21 and the second internal electrode 23 in the varistor layers 25, 27. The varistor 63, as shown in FIG. 3, is electrically connected between a connection point (external conductor 9) between the first internal conductor 11 and the second internal conductor 13, and the third terminal electrode 7.

The first internal conductor 11 and the second internal conductor 13 mutually coupled in the polarity-reversed relation can be transformed into a first inductance component 65, a second inductance component 67, and a third inductance component 69, as shown in FIG. 4. The first inductance component 65 and the second inductance component 67 are connected in series between the first terminal electrode 3 and the second terminal electrode 5. The third inductance component 69 is connected between a connection point between the first inductance component 65 and the second inductance component 67 connected in series, and the varistor 63. Let Lz be the inductance of each internal conductor 11, 13 and Kz be the coupling coefficient between the internal conductors 11, 13, and then the inductance of the first inductance component 65 and the second inductance component 67 is given by (1+Kz)Lz and the inductance of the third inductance component 69 by −KzLz.

The varistor 63 can be transformed into a variable resistor 71 and a stray capacitance component 73 connected in parallel between the third inductance component 69 and the third terminal electrode 7, as shown in FIG. 4. The variable resistor 71 usually has a large resistance and decreases the resistance with application of a high-voltage surge. The varistor 63 can be approximated by only the stray capacitance component 73 for high-speed signals of small amplitude.

The input impedance Zin of the surge absorber SA1 shown in FIG. 4 is represented by Eq (1) below. In this equation, the capacitance of the capacitance component 61 is represented by Cs, and the capacitance of the stray capacitance component 73 of the varistor 63 by Cz. The DC resistance has little influence on the impedance, and, therefore, let us consider the equation as to the capacitance component and the inductance components.

$$Zin = \sqrt{\frac{2(1+Kz)Lz}{Cz} \frac{1-\omega^2 Lz((1-Kz)Cz/2)}{1-\omega^2 Lz(2(1+Kz)Cs)}} \quad (1)$$

In Eq (1), if the capacitance Cs of the capacitance component 61 is set to satisfy Eq (2) below, the input impedance Zin becomes independent of frequency characteristics. When the capacitance Cs of the capacitance component 61 is set as represented by Eq (2) below and if the inductance Lz of each internal conductor is set as indicated by Eq (3) below, the input impedance Zin can be matched with the characteristic impedance Zo.

$$Cs = \frac{1 - Kz}{4(1 + Kz)} Cz \quad (2)$$

$$Lz = \frac{Z_0^2 Cz}{2(1 + Kz)} \quad (3)$$

As also seen from Eqs (2) and (3) above, the coupling coefficient Kz between the internal conductors 11, 13 can be arbitrarily selected, which enables highly flexible circuit design.

Therefore, the present embodiment is able to provide the surge absorber SA1 as a surge absorber with excellent impedance matching for high-speed signals as well, while protecting a semiconductor device or the like from static electricity of high voltage.

Figure 5:
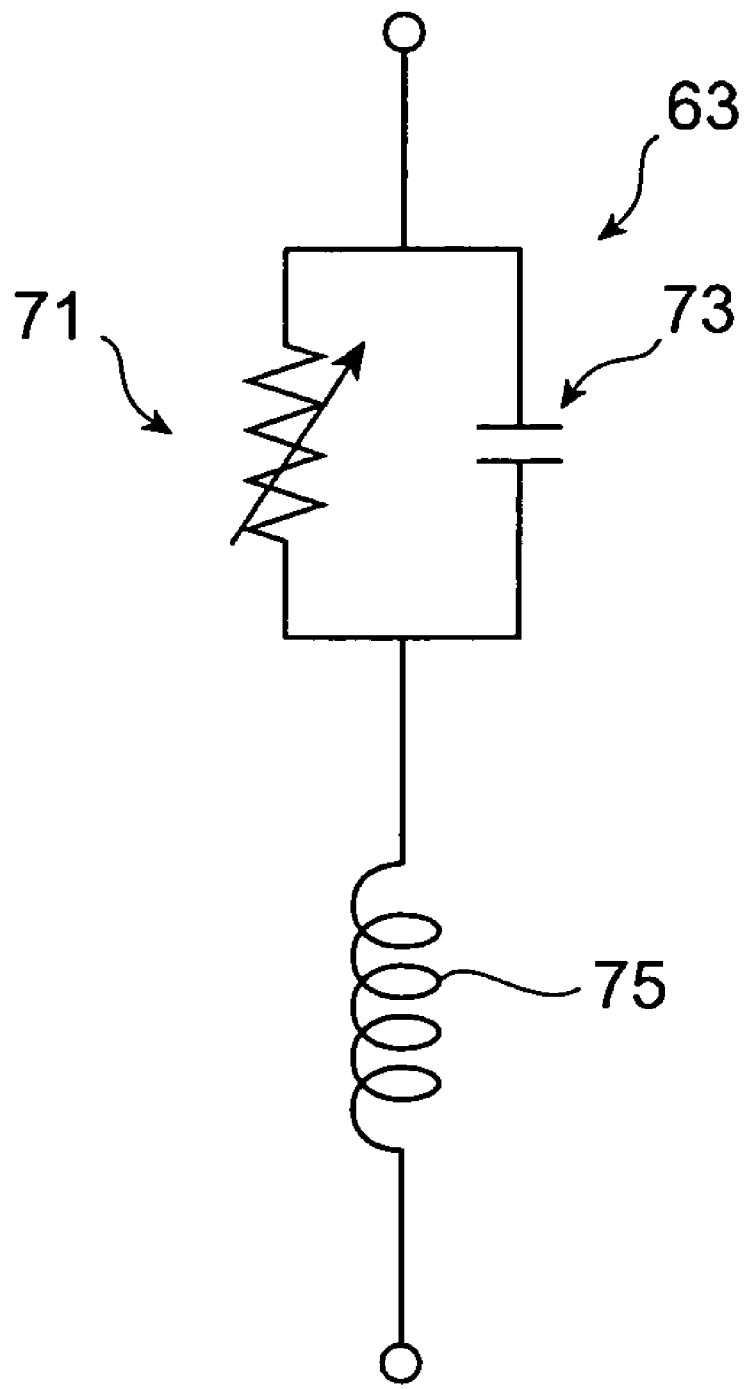
FIG. 5 is a diagram showing an equivalent circuit of a varistor.

Incidentally, the varistor 63 also includes a stray inductance component 75, as shown in FIG. 5. Usually, the variable resistor 71 has a high resistance and decreases the resistance with application of a high-voltage surge. However, the stray capacitance component 73 and the stray inductance component 75 exist in the varistor 63. For this reason, if the surge absorber SA1 is added to the input side of a semiconductor device handling a high-speed signal as an input signal, it will cause deterioration of the high-speed signal. For applying the surge absorber SA1 to a circuit handling a high-speed signal, it is preferable to reduce the influence of the stray inductance component 75 as well as the stray capacitance component 73.

As also seen from the equivalent circuit shown in FIG. 4, the stray inductance component 75 of the varistor 63 can be canceled by making use of the third inductance component 69 with a negative inductance. However, this is apparently the same as a state in which the coupling becomes smaller, and thus the capacitance Cs of the capacitance component 61 is reduced to Eq (4) below, while maintaining the coupling coefficient Kz and the inductance Lz. In this equation the inductance of the stray inductance component 75 is represented by Le.

$$Cs = \frac{1 - Kz + 2Le/Lz}{4(1 + Kz)} Cz \quad (4)$$

However, $KzLz \geq Le$. When the circuit is designed in this manner, the input impedance Zin can be matched with the characteristic impedance Zo even if the surge absorber SA1 includes the stray capacitance component 73 and the stray inductance component 75.

Figure 6:
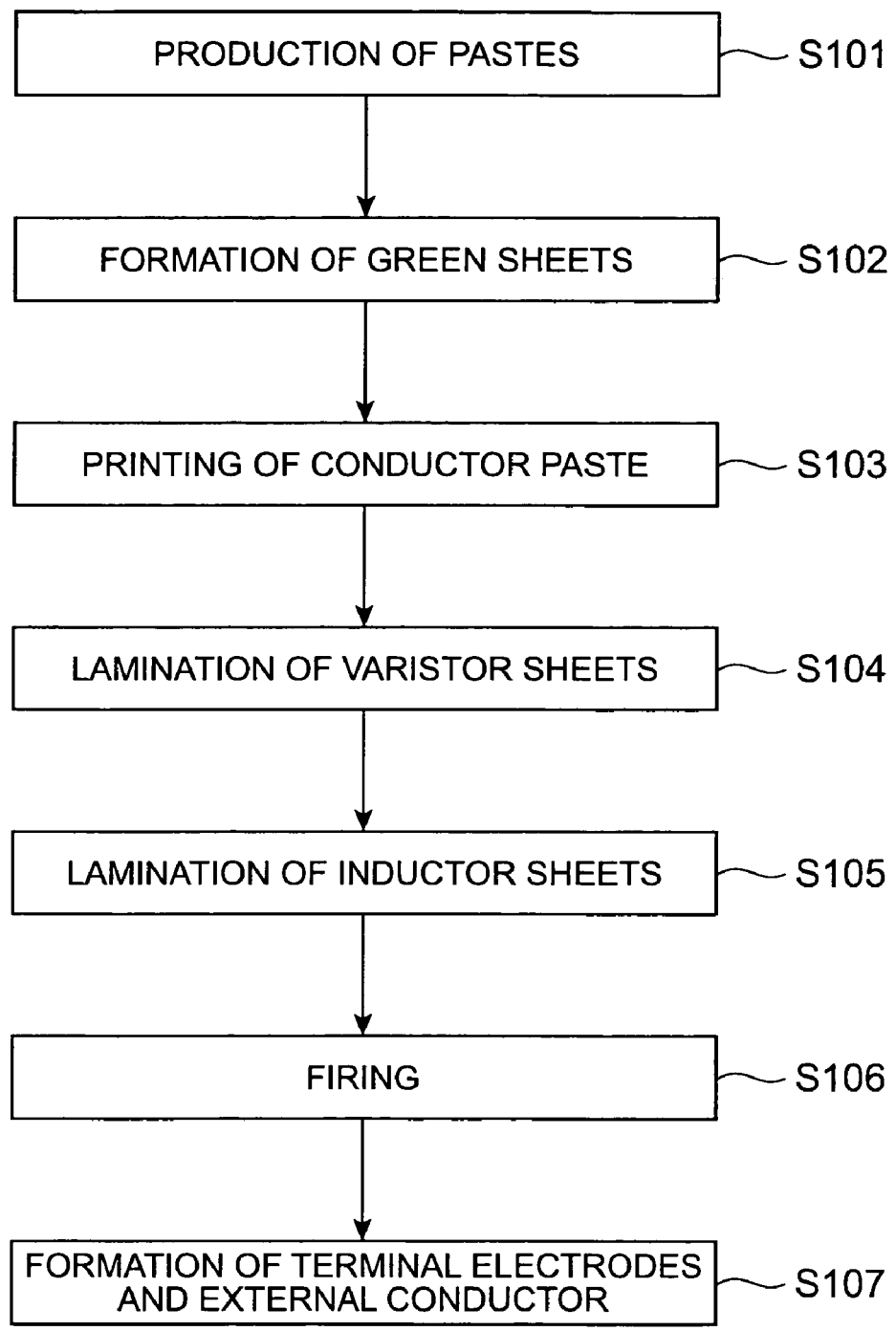
FIG. 6 is a flowchart for explaining steps for producing the surge absorber according to the first embodiment.

A method of producing the surge absorber SA1 according to the first embodiment will be described below with reference to FIG. 6. FIG. 6 is a flowchart for explaining steps of producing the surge absorber of the first embodiment.

The first step for production of the surge absorber SA1 is to produce a paste containing the ceramic material as a raw material for the inductor layers 15, 17 and a paste containing the ceramic material as a raw material for the varistor layers 25, 27 (step S101). Specifically, the paste for formation of the varistor layers 25, 27 can be prepared by adding additives, at least one element selected from the group consisting of the rare earths (e.g., Pr) and Bi, and Co and, if necessary, Al, Cr, Ca, Si, K, and the like, to the principal component of ZnO so that they are contained in desired contents after fired, adding a binder or the like into these, and mixing them. The metal elements in this case can be added, for example, in the form of oxides thereof.

The paste for formation of the inductor layers 15, 17 can be prepared by adding additives, a rare earth and a metal element such as Bi, as needed, to the principal component of ZnO, further adding a binder or the like to these, and mixing them. The paste for formation of the inductor layers 15, 17 does not contain Co, different from the paste for formation of the varistor layers 25, 27. The foregoing metal element can be added in the form of a compound such as oxide, oxalate, or carbonate. Amounts of the additives are adjusted so that the metal element is contained in a desired content as described above, in the element body 1 after subjected to firing as described below.

These pastes are applied onto plastic film or the like by the doctor blade method or the like, and then dried to form green sheets of the ceramic materials (step S102). This step obtains the required number of green sheets for formation of the inductor layers 15, 17 (hereinafter referred to as "inductor sheets") and the required number of green sheets for formation of the varistor layers 25, 27 (hereinafter referred to as "varistor sheets"). In the above step of forming the green sheets, the plastic film or the like may be peeled off from each sheet immediately after the application and drying, or peeled off immediately before an after-described laminating step. In this green sheet forming step, a green sheet for formation of the protecting layer 50 containing ZnO is also formed by a method similar to the above, in addition to these sheets.

Next, a conductor paste for forming the first and second internal conductors 11, 13 or for forming the first and second internal electrodes 21, 23 is screen-printed on the inductor sheets or on the varistor sheets so that a desired pattern is formed on each sheet (step S103). This step obtains the sheets provided with the respective conductor paste layers having the desired patterns. Here the conductor paste layers with the desired patterns for formation of the first and second internal conductors 11, 13 are formed so that the first and second internal conductors 11, 13 obtained by firing them in a subsequent step have their respective desired DC resistance components described above. The conductor paste can be, for example, one containing the principal component of Pd, or Ag—Pd alloy.

The subsequent step is to successively laminate the varistor sheets with the conductor paste layers corresponding to the first and second internal electrodes 21, 23 (step S104). The next step is to successively laminate the inductor sheets with the conductor paste layers corresponding to the first and second internal conductors 11, 13 (step S105). Furthermore, the green sheet for formation of the protecting layer 50 is further laid on the laminated structure of these sheets, and these are pressed to obtain a laminate body being a precursor for element body 1.

Thereafter, the laminate obtained is cut in a chip unit of a desired size and thereafter this chip is fired at a predetermined temperature (e.g., 1000-1400° C.) to obtain the element body 1 (step S106). Subsequently, Li is diffused from the surface of the resultant element body 1 into the interior thereof. In this case, an Li compound is attached to the surface of the resultant element body 1 and a thermal treatment or the like is then performed. A hermetically closed rotary pot can be used for the attachment of the Li compound. There are no particular restrictions on the Li compound, but it is preferably a compound that can diffuse Li from the surface of the element body 1 to the vicinity of the first and second internal conductors 11, 13 or to the vicinity of the first and second internal electrodes 21, 23 by the thermal treatment; for example, it can be selected from an oxide, hydroxide, chloride, nitrate, borate, carbonate, oxalate, or the like of Li. It is noted that this Li diffusing step is not always essential in the production of the surge absorber SA1.

Then a paste consisting primarily of silver is transferred onto the side faces of this Li-diffused element body 1, then baked, and further plated to form each of the first terminal electrode 3, second terminal electrode 5, third terminal electrode 7, and external conductor 9, thereby obtaining the surge absorber SA1 (step S107). The plating can be conducted by electroplating, for example, using Cu and Ni and Sn; Ni and Sn; Ni and Au; Ni and Pd and Au; Ni and Pd and Ag; or, Ni and Ag.

In the first embodiment, as described above, the inductor portion 10 has the first internal conductor 11 and the second internal conductor 13 mutually coupled in the polarity-reversed relation. For this reason, the influence of the stray capacitance component 73 can be canceled by properly setting the inductance of the inductor portion 10 relative to the stray capacitance component 73 of the surge absorbing portion 20. As a result of this, the input impedance with flat frequency characteristics can be realized over a wide band.

In the first embodiment, the surge absorber SA1 has the resistor portion having the DC resistance component 62. This makes the impedance of the surge absorber SA1 relatively large. For this reason, the surge absorber SA1 has the impedance relatively higher than that of an element to be protected, such as an IC or LSI, for high-frequency components of the electrostatic pulse. This results in preventing the electrostatic pulse from flowing through the element to be protected and effectively guides the electrostatic pulse to the surge absorbing portion 20 (varistor 63), so as to enhance the ESD protection level by the surge absorber SA1.

Furthermore, in the first embodiment the resistor portion has the first DC resistance component 62a and the second DC resistance component 62b larger than the first DC resistance component 62a. This makes relatively large the impedance of the surge absorber SA1, particularly, the circuit portion between the surge absorbing portion 20 (varistor 63) and the second terminal electrode 5. For this reason, the circuit portion between the surge absorbing portion 20 (varistor 63) and the second terminal electrode 5 has the impedance relatively higher than that of the element to be protected, such as an IC or LSI, for high-frequency components of the electrostatic pulse generated, for example, upon contact between a human body and a terminal of electronic equipment. In consequence, when the element to be protected is connected to the second terminal electrode 5, the electrostatic pulse is prevented from flowing through the element to be protected, and is effectively guided to the surge absorbing portion 20 (varistor 63), so as to enhance the ESD protection level by the surge absorber.

In the first embodiment the combined DC resistance component of the first DC resistance component 62a and the second DC resistance component 62b is set in the range of 0Ω to 7.5Ω inclusive. This achieves impedance matching even in the case where the surge absorber SA1 is inserted in the transmission lines in the differential transmission method such as the HDMI.

In the first embodiment the first DC resistance component 62a is constructed of the first internal conductor 11 and the second DC resistance component 62b is constructed of the second internal conductor 13. In this case, there is no need for provision of a separate resistor or the like for construction of the resistor portion, and it is thus feasible to simplify the configuration of the absorber SA1 and to achieve downsizing of the absorber SA1. In the first embodiment, the combined DC resistance component of the first DC resistance component 62a of the first internal conductor 11 and the second DC resistance component 62b of the second internal conductor 13 is set in the range of 0Ω to 7.5Ω inclusive.

In the first embodiment the surge absorber SA1 further comprises the capacitor portion having the capacitance component 61. This permits us to flexibly set the inductance of the inductor portion 10 and the capacitance of the capacitance component 61 of the capacitor portion relative to the stray capacitance component 73 of the surge absorbing portion 20.

The surge absorber SA1 of the first embodiment can be constructed as the surge absorber SA1 with superior impedance matching for high-speed signals as well, while protecting a semiconductor device or the like from static electricity of high voltage.

In the first embodiment the capacitance component 61 of the capacitor portion is formed by the first internal conductor 11 and the second internal conductor 13. This eliminates the need for provision of separate internal electrodes or the like for construction of the capacitor portion, and it is thus feasible to simplify the configuration of the surge absorber SA1 and to achieve downsizing of the surge absorber SA1.

In the first embodiment, the inductor portion 10 is comprised of the lamination of the inductor layer 15 on which the first internal conductor 11 is formed, and the inductor layer 17 on which the second internal conductor 13 is formed, and the first internal conductor 11 and second internal conductor 13 include the mutually overlapping regions 11a, 13a when viewed from the laminate direction of the inductor layers 15, 17. In consequence, the mutually overlapping regions 11a, 13a, when viewed from the laminate direction of the inductor layers 15, 17, in the first internal conductor 11 and the second internal conductor 13 are capacitance-coupled to each other, and the regions 11a, 13a form the aforementioned capacitance component 61. This eliminates the need for provision of separate internal electrodes or the like for construction of the capacitor portion, and it is thus feasible to simplify the configuration of the surge absorber SA1 and to achieve downsizing of the surge absorber SA1.

In the first embodiment, the surge absorbing portion 20 is comprised of the lamination of the varistor layer 25 on which the first internal electrode 21 is formed, and the varistor layer 27 on which the second internal electrode 23 is formed, and the first internal electrode 21 and the second internal electrode 23 include the mutually overlapping regions when viewed from the laminate direction of the varistor layers 25, 27. This permits the surge absorbing portion 20 to be constructed of varistor 63.

In the first embodiment, the inductor layers 15, 17 constituting the inductor portion 10, and the varistor layers 25, 27 constituting the surge absorbing portion 20 all are made of the respective ceramic materials containing ZnO as the principal component. For this reason, the difference of volume changes during firing is extremely small between the inductor portion 10 and the surge absorbing portion 20. Therefore, strain, stress, or the like will be unlikely to occur between them even if they are simultaneously fired. As a result, the surge absorber SA1 obtained becomes extremely resistant to delamination between the inductor portion 10 and the surge absorbing portion 20, when compared with the conventional surge absorber SA1 in which the inductor portion 10 and the surge absorbing portion 20 are made of different materials.

The inductor layers 15, 17, as described above, are made of the ceramic material containing ZnO as the principal component and substantially not containing Co as an additive. Such material has the resistivity high enough to be used as the constituent material of the inductor. Specifically, the material is likely to have the resistivity over 1 MΩ suitable for the inductor material. For this reason, the inductor portion 10 becomes capable of exhibiting excellent inductor characteristics even though it contains the principal component of ZnO which singly demonstrates insufficient characteristics in terms of the resistivity.

In the first embodiment, the other end of the first internal conductor 11, the other end of the second internal conductor 13, and the first internal electrode 21 are connected through the external conductor 9. This enables easy and secure connection among the other end of the first internal conductor 11, the other end of the second internal conductor 13, and the first internal electrode 21.

There are the following techniques for adjusting the first DC resistance component $62a$ of the first internal conductor 11 and the second DC resistance component $62b$ of the second internal conductor 13 to the aforementioned desired values. A technique is to adjust the width, thickness, length, or the like of the first and second internal conductors 11, 13. Another technique is to adjust the resistivity by selecting the metal material contained in the conductor paste for formation of the first and second internal conductors 11, 13. Another technique is to adjust the density of the first and second internal conductors 11, 13 by adjusting a formulation ratio of the metal materials contained in the conductor paste or by adjusting grain sizes of the metal materials.

Second Embodiment

Figure 7:
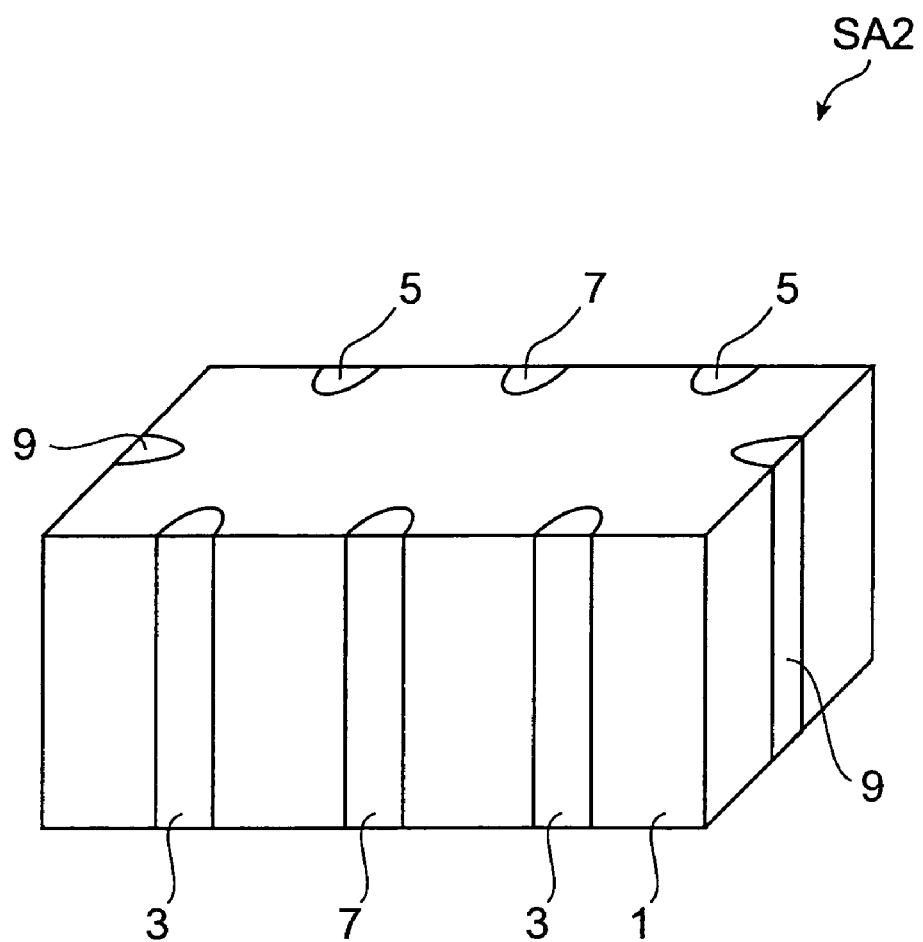
FIG. 7 is a schematic perspective view showing a surge absorber according to the second embodiment.
Figure 8:
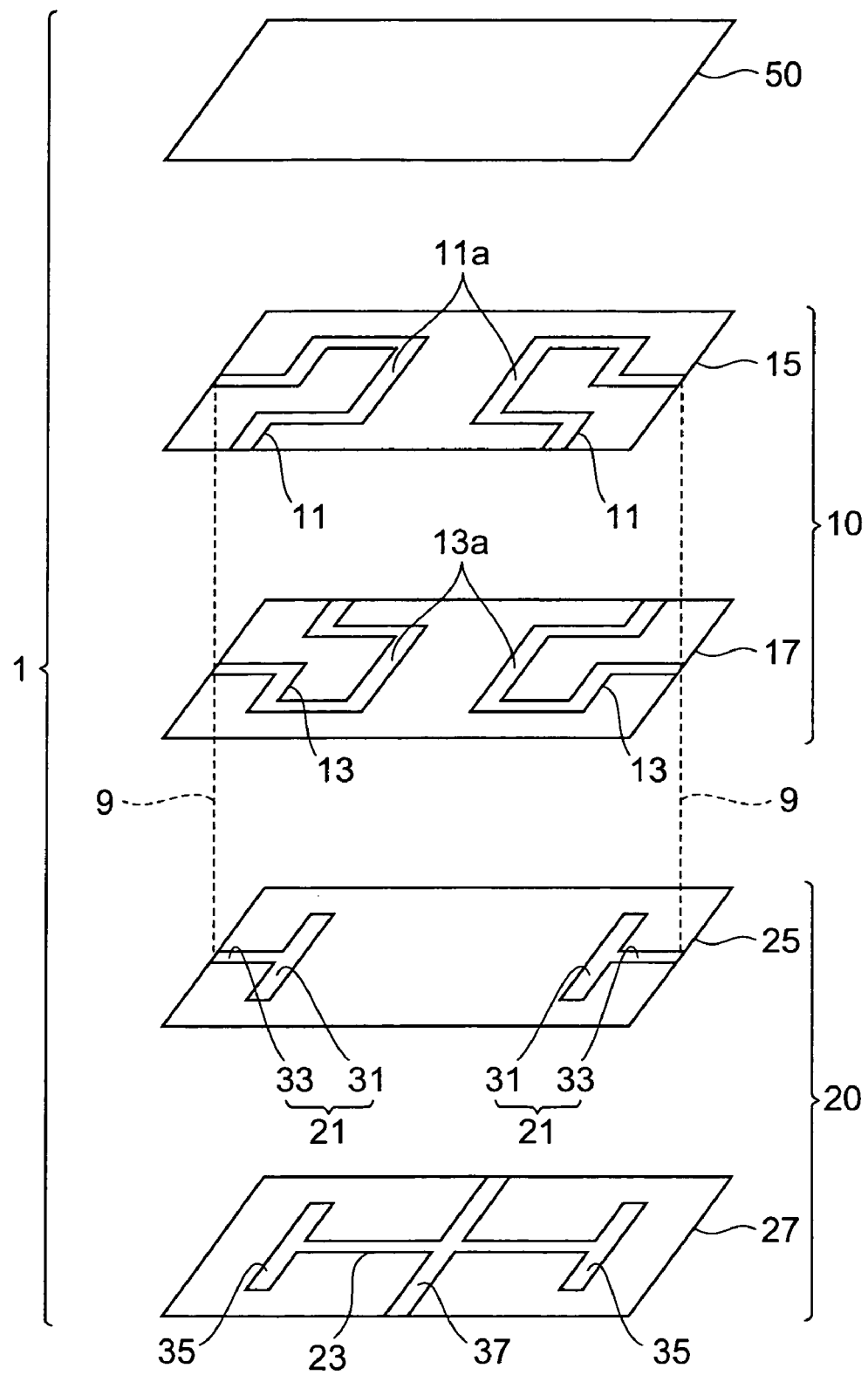
FIG. 8 is an exploded perspective view for explaining a configuration of an element body included in the surge absorber according to the second embodiment.

A configuration of surge absorber SA2 according to the second embodiment will be described below based on FIGS. 7 and 8. FIG. 7 is a schematic perspective view showing the surge absorber according to the second embodiment. FIG. 8 is an exploded perspective view for explaining a configuration of an element body included in the surge absorber of the second embodiment. The surge absorber SA2 of the second embodiment is different from the surge absorber SA1 of the first embodiment in the number of each of the first terminal electrode 3, second terminal electrode 5, third terminal electrode 7, first internal conductor 11, second internal conductor 13, first internal electrode 21, second internal electrode 23, and external conductor 9.

The surge absorber SA2, as shown in FIG. 7, has an element body 1. The element body 1 is of rectangular parallelepiped shape and is set, for example, to the length of about 1.4 mm, the width of about 1.0 mm, and the height of about 0.5 mm. The surge absorber SA2 is provided with a plurality of first terminal electrodes 3, second terminal electrodes 5, third terminal electrodes 7, and external conductors 9 (two each in the present embodiment). The first terminal electrodes 3, second terminal electrodes 5, and third terminal electrodes 7 each are arranged to face each other on side faces of the element body 1. The external conductors 9 are formed at the respective longitudinal ends of the element body 1.

The inductor portion 10, as shown in FIG. 8, has a plurality of first internal conductors 11 and second internal conductors 13 (two each in the second embodiment) mutually coupled in a polarity-reversed relation. The first internal conductors 11 have such a predetermined spacing as to be electrically insolated from each other, on the inductor layer 15. The second internal conductors 13 have such a predetermined spacing as to be electrically isolated from each other, on the inductor layer 17.

The DC resistance component of each second internal conductor 13 is larger than that of each first internal conductor 11. The combined DC resistance component of the DC resistance component of each first internal conductor 11 and the DC resistance component of each second internal conductor 13 is set in the range of 0Ω to 7.5Ω inclusive. In the surge absorber SA2, the inductor portion 10 has the DC resistance component in the range of 0Ω to 15Ω inclusive. In the present embodiment the DC resistance component of each first internal conductor 11 is set to about 0.5Ω and the DC resistance component of each second internal conductor 13 to about 4.5Ω. In the surge absorber SA2, therefore, the inductor portion 10 has the DC resistance component of about 10Ω.

The surge absorbing portion 20, as shown in FIG. 8, has a plurality of first internal electrodes 21 and second internal electrodes 23 (two each in the present embodiment).

The first internal electrodes 21 have such a predetermined spacing as to be electrically isolated from each other, on the varistor layer 25. Each first internal electrode 21 includes a first electrode portion 31 and a second electrode portion 33. The first electrode portion 31 overlaps with a first electrode portion 35 of a second internal electrode 23 described later, when viewed from the laminate direction of the varistor layers 25, 27. The first electrode portion 31 is of approximately rectangular shape. The second electrode portion 33 is led from the first electrode portion 31 so as to be exposed in a side face of the element body 1 (the side face on which the external conductor 9 is formed), and functions as a lead conductor. Each first electrode portion 31 is electrically connected through the second electrode portion 33 to the external conductor 9. The second electrode portion 33 is formed integrally with the first electrode portion 31.

Each second internal electrode 23 includes a first electrode portion 35 and a second electrode portion 37. The first electrode portion 35 is formed so as to overlap with the first electrode portion 31 of the first internal electrode 21 when viewed from the laminate direction of the varistor layers 25, 27. Each first electrode portion 35 is of approximately rectangular shape. The second electrode portions 37 are led from the respective first electrode portions 35 so as to be exposed in the two side faces of the element body 1 (the two side faces on which the third terminal electrodes 7 are formed), and function as lead conductors. Each first electrode portion 35 is electrically connected through the second electrode portion 37 to the third terminal electrode 7. The second electrode portion 37 is formed integrally with the first electrode portion 35.

Figure 9:
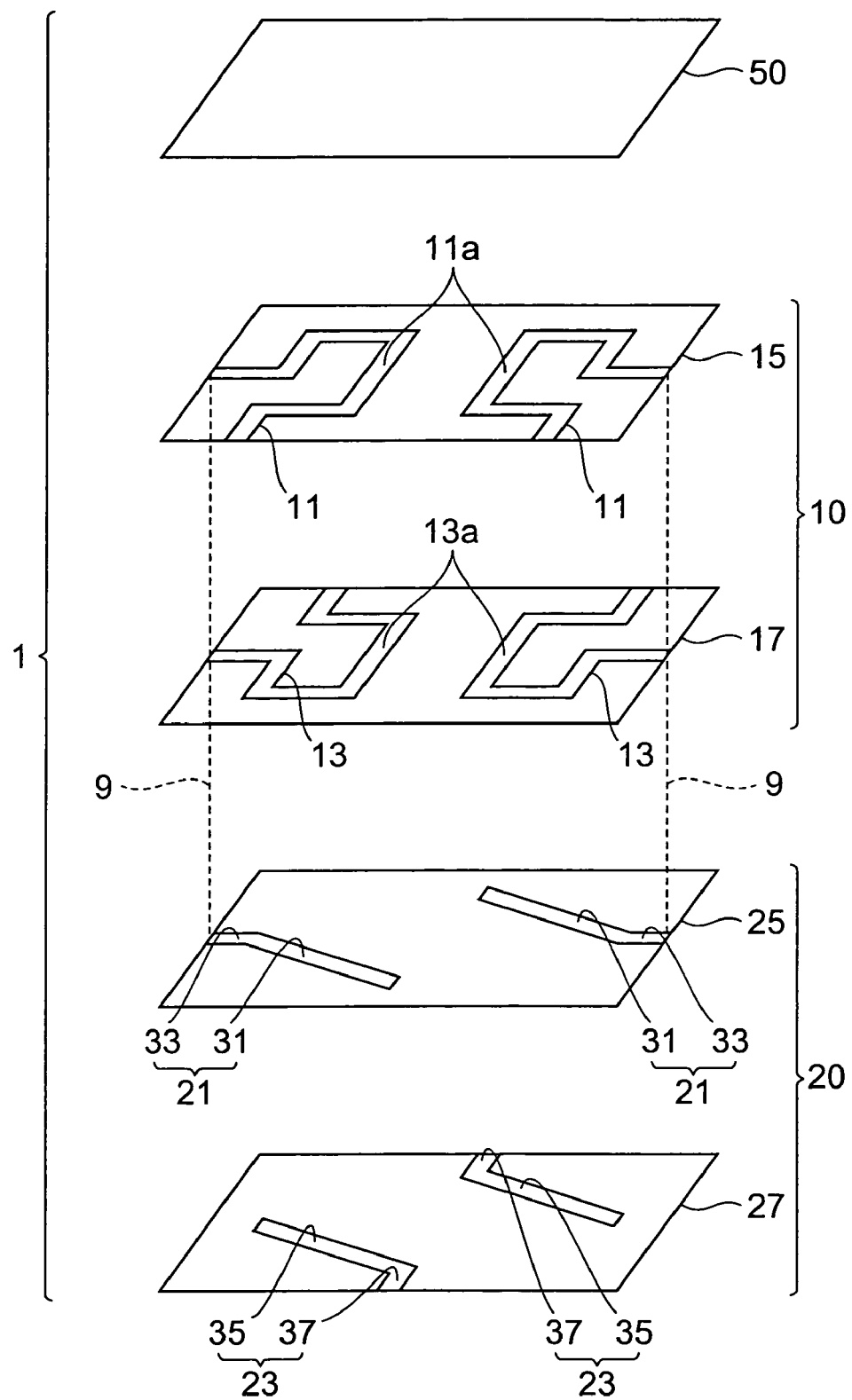
FIG. 9 is an exploded perspective view for explaining a configuration of a modification example of the element body included in the surge absorber according to the second embodiment.

The second internal electrodes 23 may also be arranged to have such a predetermined spacing as to be electrically isolated from each other, on the varistor layer 27, as shown in FIG. 9. In this case, each second electrode portion 37, as shown in FIG. 9, is led from each first electrode portion 35 to be exposed in the side face of the element body 1 (the side face on which the third terminal electrode 7 is formed).

In the surge absorbing portion 20, one varistor is constructed of the first electrode portion 31, the first electrode portion 35, and the overlapping regions with the first electrode portion 31 and the first electrode portion 35 in the varistor layers 25, 27.

As described above, the second embodiment is also able to protect a semiconductor device or the like from static electricity of high voltage as the first embodiment was, and achieves superior impedance matching for high-speed signals.

In the second embodiment, as in the first embodiment, the electrostatic pulse is also prevented from flowing through the element to be protected, and is effectively guided to the surge absorbing portion 20 (varistor 63), so as to enhance the ESD protection level by the surge absorber SA2.

In the second embodiment, the surge absorber has the first terminal electrodes 3, the second terminal electrodes 5, the third terminal electrodes 7, the first internal conductors 11, the second internal conductors 13, the first internal electrodes 21, and the second internal electrodes 23 two or more each. This can realize the surge absorber SA2 in an array form.

Third Embodiment

Figure 10:
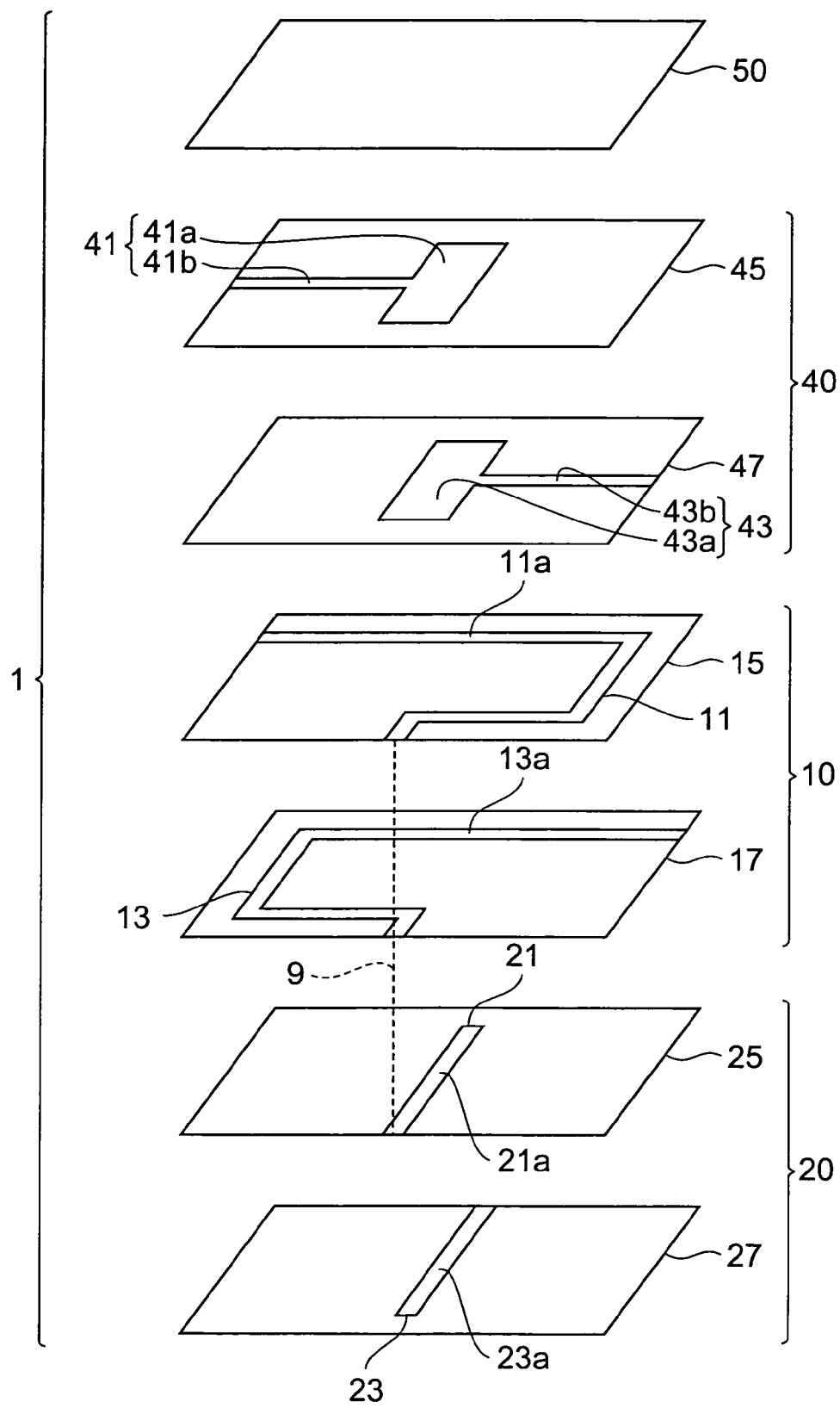
FIG. 10 is an exploded perspective view for explaining a configuration of an element body included in the surge absorber according to the third embodiment.

A configuration of a surge absorber according to the third embodiment will be described below based on FIG. 10. FIG. 10 is an exploded perspective view for explaining a configuration of an element body included in the surge absorber of the third embodiment. The surge absorber of the third embodiment is different in a configuration of capacitor portion 40 from the surge absorber SA1 of the first embodiment.

The surge absorber of the third embodiment is provided with an element body 1, a first terminal electrode 3, a second terminal electrode 5, a third terminal electrode 7, and an external conductor 9 as the surge absorber SA1 shown in FIG. 1 was. The element body 1, as shown in FIG. 10, has an inductor portion 10, a surge absorbing portion 20, and a capacitor portion 40. The element body 1 is constructed in a structure in which the surge absorbing portion 20, inductor portion 10, capacitor portion 40, and protecting layer 50 are laminated in order from bottom in the drawing.

The DC resistance component of the second internal conductor 13 is larger than that of the first internal conductor 11. The combined DC resistance component of the DC resistance component of the first internal conductor 11 and the DC resistance component of the second internal conductor 13 is set in the range of 0Ω to 7.5Ω inclusive. In the surge absorber of the third embodiment, the inductor portion 10 has the DC resistance component in the range of 0Ω to 15Ω inclusive. In the present embodiment, the DC resistance component of the first internal conductor 11 is set to about 0.5Ω, and the DC resistance component of the second internal conductor 13 to about 4.5Ω. In the surge absorber of the third embodiment, therefore, the inductor portion 10 has the DC resistance component of about 10Ω.

The capacitor portion 40 has a third internal electrode 41 and a fourth internal electrode 43. The capacitor portion 40 is comprised of a lamination of a dielectric layer 45 on which the third internal electrode 41 is formed, and a dielectric layer 47 on which the fourth internal electrode 43 is formed.

The third internal electrode 41 includes a first electrode portion 41a and a second electrode portion 41b. The first electrode portion 41a overlaps with a first electrode portion 43a of the fourth internal electrode 43 described later, when viewed from the laminate direction of the dielectric layers 45, 47. The first electrode portion 41a is of approximately rectangular shape. The second electrode portion 41b is led from the first electrode portion 41a so as to be exposed in one end face of the element body 1 (the end face on which the first terminal electrode 3 is formed), and functions as a lead conductor. The first electrode portion 41a is electrically connected through the second electrode portion 41b to the first terminal electrode 3. The second electrode portion 41b is formed integrally with the first electrode portion 41a.

The fourth internal electrode 43 includes a first electrode portion 43a and a second electrode portion 43b. The first electrode portion 43a overlaps with the first electrode portion 41a of the third internal electrode 41, when viewed from the laminate direction of the dielectric layers 45, 47. The first electrode portion 43a is of approximately rectangular shape. The second electrode portion 43b is led from the first electrode portion 43a so as to be exposed in the other end face of the element body 1 (the end face on which the second terminal electrode 5 is formed), and functions as a lead conductor. The first electrode portion 43a is electrically connected through the second electrode portion 43b to the second terminal electrode 5. The second electrode portion 43b is formed integrally with the first electrode portion 43a.

The first electrode portion 41a of the third internal electrode 41 and the first electrode portion 43a of the fourth internal electrode 43 are capacitance-coupled, so that the third internal electrode 41 and the fourth internal electrode 43 form a capacitance component 61. For this reason, the capacitor portion 40 has the capacitance component 61 connected between the first terminal electrode 3 and the second terminal electrode 5.

Each dielectric layer 45, 47 is a layer made of a ceramic material. There are no particular restrictions on the constituent material of the dielectric layers 45, 47, and a variety of ceramic materials or the like are applicable. However, the material is preferably one containing ZnO as a principal component, in terms of reduction of delamination from the laminated structure described above.

As described above, the third embodiment is also able to protect a semiconductor device or the like from static electricity of high voltage as the first embodiment was, and achieves superior impedance matching for high-speed signals.

In the third embodiment, as in the first embodiment, the electrostatic pulse is also prevented from flowing through the element to be protected, and is effectively guided to the surge absorbing portion 20 (varistor 63), so as to enhance the ESD protection level by the surge absorber SA3.

Fourth Embodiment

Figure 11:
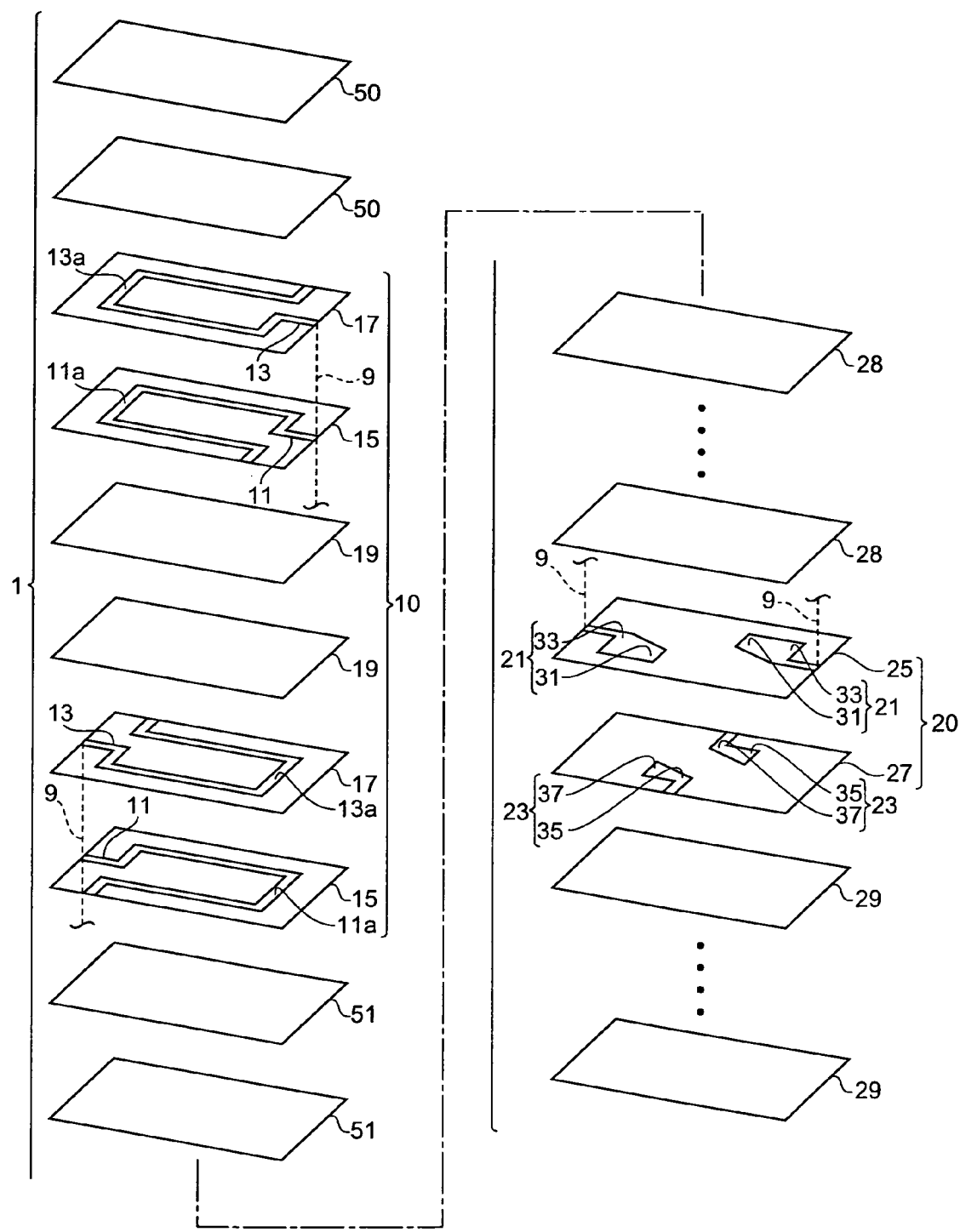
FIG. 11 is an exploded perspective view for explaining a configuration of an element body included in the surge absorber according to the fourth embodiment.

A configuration of a surge absorber according to the fourth embodiment will be described below based on FIG. 11. FIG. 11 is an exploded perspective view for explaining a configuration of an element body included in the surge absorber according to the fourth embodiment. The surge absorber of the fourth embodiment is different in the configurations of the inductor portion 10 and the surge absorbing portion 20 from the surge absorber SA2 of the second embodiment.

The surge absorber of the fourth embodiment is provided with an element body 1, and a plurality of first terminal electrodes 3, second terminal electrodes 5, third terminal electrodes 7, and external conductors 9 (two each in the present embodiment) as the surge absorber SA2 shown in FIG. 7 was.

The inductor portion 10 is provided with a plurality of inductor layers 15 (two layers in the present embodiment) on each of which a first internal conductor 11 is formed, and a plurality of inductor layers 17 (two layers in the present embodiment) on each of which a second internal conductor 13 is formed. The inductor portion 10 is comprised of a lamination of pairs of inductor layers 15 and inductor layers 17, each pair including one inductor layer 15 and one inductor layer 17.

The DC resistance component of each second internal conductor 13 is larger than that of each first internal conductor 11. The combined DC resistance component of the DC resistance component of each first internal conductor 11 and the DC resistance component of each second internal conductor 13 is set in the range of 0Ω to 7.5Ω inclusive. In the surge absorber of the fourth embodiment, the inductor portion 10 has the DC resistance component in the range of 0Ω to 15Ω inclusive. In the present embodiment, the DC resistance component of each first internal conductor 11 is set to about 0.5Ω, and the DC resistance component of each second internal conductor 13 to about 4.5Ω. In the surge absorber of the fourth embodiment, therefore, the inductor portion 10 has the DC resistance component of about 10Ω.

The inductor portion 10 is provided with a plurality of (two in the present embodiment) dielectric layers (dummy layers) 19 without any internal conductor. The dielectric layers 19 are located between the first inductor layer pair composed of the inductor layer 15 and inductor layer 17 and the second inductor layer pair composed of the inductor layer 15 and inductor layer 17. The dielectric layers 19 are layers for preventing the second internal conductor 13 formed on the inductor layer 17 making the first inductor layer pair, and the first internal conductor 11 formed on the inductor layer 15 making the second inductor layer pair, from being coupled in a polarity-reversed relation. There are no particular restrictions on the constituent material of the dielectric layers 19, and a variety of ceramic materials or the like are applicable. However, the material is preferably one containing ZnO as a principal component, as was the case with the inductor layers 15, 17, in terms of reduction of delamination from the aforementioned laminated structure.

A plurality of (two in the present embodiment) dielectric layers (dummy layers) 51 without any internal conductor are also located below the inductor portion 10. A dielectric layer (dummy layer) without any internal conductor may be located between the inductor layer 15 and the inductor layer 17 constituting the first inductor layer pair. A dielectric layer (dummy layer) without any internal conductor may be located between the inductor layer 15 and the inductor layer 17 constituting the second inductor layer pair.

Supposing the length and width of the element body 1 are the same as those in the surge absorber SA2 of the second embodiment, i.e., supposing the area of the inductor layers 15, 17 is the same as that in the second embodiment, the surge absorber of the fourth embodiment enables the coil area made by the first internal conductors 11 and second internal conductors 13 to be set to a large value. As a result, the surge absorber of the fourth embodiment permits the inductance (inductance value) to be made larger than that in the surge absorber SA2 of the second embodiment.

The surge absorbing portion 20 has a plurality of first internal electrodes 21 and second internal electrodes 23 (two each in the present embodiment). A plurality of dielectric layers (dummy layers) without any internal conductor are located between the inductor portion 10 and the surge absorbing portion 20. A plurality of dielectric layers (dummy layers) 28, 29 without any internal conductor are located above and below the surge absorbing portion 20 so as to sandwich the surge absorbing portion 20 between them. There are no particular restrictions on the constituent material of the dielectric layers 28, 29, and a variety of ceramic materials or the like are applicable. However, the material is preferably one containing ZnO as a principal component, as was the case with the varistor layers 25, 27, in terms of reduction of delamination from the aforementioned laminated structure. A dielectric layer (dummy layer) without any internal conductor may be located between the varistor layer 25 and the varistor layer 27.

The first internal electrodes 21 have such a predetermined spacing as to be electrically isolated from each other, on the varistor layer 25. The second internal electrodes 23 have such a predetermined spacing as to be electrically isolated from each other, on the varistor layer 27. Each first internal electrode 21 includes a first electrode portion 31 and a second electrode portion 33. Each second internal electrode 23 includes a first electrode portion 35 and a second electrode portion 37. Each first electrode portion 31 overlaps with a first electrode portion 35, when viewed from the laminate direction of the varistor layers 25, 27. The first electrode portion 31 and the first electrode portion 35 each are of approximately trapezoidal shape.

The area of the mutually overlapping portions between each pair of first electrode portion 31 and first electrode portion 35 is set larger in the surge absorber of the fourth embodiment than in the surge absorber SA2 of the second embodiment. This can achieve low equivalent series resistance (ESR) and low equivalent series inductance (ESL). The predetermined spacing between the first internal electrodes 21 is set in consideration of crosstalk between the first internal electrodes 21 and is set to a value enough to suppress occurrence of the crosstalk. The predetermined spacing between the second internal electrodes 23 is also set in consideration of crosstalk between the second internal electrodes 23 and is set to a value enough to suppress occurrence of the crosstalk.

As described above, the fourth embodiment is also able to protect a semiconductor device or the like from static electricity of high voltage as the first embodiment was, and achieves superior impedance matching for high-speed signals.

In the fourth embodiment, as in the first embodiment, the electrostatic pulse is prevented from flowing through the element to be protected, and is effectively guided to the surge absorbing portion 20 (varistor 63), so as to enhance the ESD protection level by the surge absorber.

In the fourth embodiment the surge absorber has the plurality of first terminal electrodes 3, second terminal electrodes 5, third terminal electrodes 7, first internal conductors 11, second internal conductors 13, first internal electrodes 21, second internal electrodes 23. This can realize the surge absorber in an array form.

The above described the preferred embodiments of the present invention, but it is noted that the present invention is by no means limited to the above embodiments and can be modified in various ways without departing from the spirit and scope thereof.

The DC resistance components of the first internal conductor 11 and the second internal conductor 13 are not limited to the aforementioned values. As described above, the DC resistance component of the second internal conductor 13 is preferably larger than the DC resistance component of the first internal conductor 11 and the combined DC resistance component of the DC resistance component of the first internal conductor 11 and the DC resistance component of the second internal conductor 13 is preferably in the range of 0Ω to 7.5Ω inclusive. The DC resistance component of the first internal conductor 11 may be 0Ω.

The DC resistance component of the first internal conductor 11 may be equal to that of the second internal conductor 13. In this case, the combined DC resistance component of the DC resistance component of the first internal conductor 11 and the DC resistance component of the second internal conductor 13 is also preferably in the range of 0Ω to 7.5Ω inclusive. For example, in the first embodiment the DC resistance component of the first internal conductor 11 and the DC resistance component of the second internal conductor 13 may be set each to about 2.5Ω. In this case, the combined DC resistance component of the DC resistance component of the first internal conductor 11 and the DC resistance component of the second internal conductor 13 is approximately 5Ω. For example, in the second to fourth embodiments, the DC resistance component of each first internal conductor 11 and the DC resistance component of each second internal conductor 13 may also be set to about 2.5Ω. In this case, the inductor portion 10 of the surge absorber has the DC resistance component of about 10Ω.

In the above-described embodiments, the first DC resistance component 62a is constructed of the first internal conductor 11 and the second DC resistance component 62b is constructed of the second internal conductor 13, but they are not limited to this example. For example, the first DC resistance component 62a may be constructed of a resistor connected in series to the first internal conductor 11, and the second DC resistance component 62b may be constructed of a resistor connected in series to the second internal conductor 13.

The surge absorbers of the present invention can be optionally changed in their laminated structure and/or in the forming locations of the electrodes or the like as long as the aforementioned equivalent circuit or a circuit with equivalent functionality thereto can be constructed. Specifically, the above-described embodiments exemplified the structures in which the inductor portion 10 was located above the surge absorbing portion 20, but it is also possible to adopt, for example, a structure in which an inductor portion 10 is interposed between a pair of surge absorbing portions 20. The positional relations of the terminal electrodes 3-7 and external conductor 9 may be optionally modified. In either case of these structures, the surge absorber SA1 can be obtained with the excellent effect as described above.

The embodiments employed the varistor 63 as the surge absorbing portion 20, but the surge absorbing portion is not limited to it. The surge absorbing portion 20 can be a capacitor, a PN junction (e.g., a Zener diode, a silicon surge clamper, or the like), a gap discharge element, or the like.

The number of layers in each of the inductor portion 10, surge absorbing portion 20, capacitor portion 40, and protecting layer 50 is not always limited to those in the above embodiments. Namely, for example, inductor layers 15, 17 with internal conductors may be repeatedly laminated to further increase the number of turns in the coil pattern. Furthermore, varistor layers 25, 27 with internal electrodes may be further repeatedly laminated. The numbers of these layers laminated can be appropriately adjusted so as to match desired characteristics of the surge absorber.

Incidentally, if the material making the inductor layers 15, 17 has a high permittivity in the laminated structure of the internal conductors in the inductor portion 10 of the surge absorber, the internal conductors adjacent in the lamination direction will be coupled to produce a parasitic capacitance between the internal conductors. Therefore, it would be difficult to apply the surge absorber of the structure in which the internal conductors are laminated in the inductor portion 10, particularly, to high-frequency applications. From this point of view, the inductor layers 15, 17 preferably have a low permittivity and, specifically, preferably have the specific permittivity of not more than 50.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A surge absorber comprising:
   a first terminal electrode;
   a second terminal electrode;
   a third terminal electrode;
   an inductor portion having a first internal conductor and a second internal conductor mutually coupled in a polarity-reversed relation such that current through the first and the second internal conductors, respectively, flow in the same direction, wherein one end of the first internal conductor is connected to the first terminal electrode, one end of the second internal conductor is connected to the second terminal electrode, and an other end of the first internal conductor is connected to an other end of the second internal conductor;
   a surge absorbing portion having a first internal electrode connected to the other end of the first internal conductor and to the other end of the second internal conductor, and a second internal electrode connected to the third terminal electrode; and
   a resistor portion having a DC resistance component connected between the first terminal electrode and the second terminal electrode,
   wherein the resistor portion has a first DC resistance component connected between the first terminal electrode and the first internal electrode, and a second DC resistance component being larger than the first DC resistance component and connected between the first internal electrode and the second terminal electrode.

2. The surge absorber according to claim 1,
   wherein the inductor portion is comprised of a lamination of an inductor layer on which the first internal conductor is formed, and an inductor layer on which the second internal conductor is formed,
   wherein the surge absorbing portion is comprised of a lamination of a varistor layer on which the first internal electrode is formed, and a varistor layer on which the second internal electrode is formed,
   wherein the first internal conductor and the second internal conductor include mutually overlapping regions when viewed from a laminate direction of the inductor layers, and
   wherein the first internal electrode and the second internal electrode include mutually overlapping regions when viewed from a laminate direction of the varistor layers.

3. The surge absorber according to claim 2,
   wherein each of the varistor layers contains ZnO as a principal component and contains at least one element selected from the group consisting of rare earths and Bi, and Co as additives, and
   wherein each of the inductor layers contains ZnO as a principal component and substantially does not contain Co.

4. The surge absorber according to claim 1,
   wherein the first terminal electrode, the second terminal electrode, and the third terminal electrode are formed on an external surface of an element body including the inductor portion, the surge absorbing portion, and the resistor portion, and
   wherein the other end of the first internal conductor, the other end of the second internal conductor, and the first internal electrode are connected through an external conductor formed on the external surface of the element body.

5. The surge absorber according to claim 1, comprising:
   two or more of each of the first terminal electrode, the second terminal electrode, the third terminal electrode, the first internal conductor, the second internal conductor, the first internal electrode, and the second internal electrode.

6. The surge absorber according to claim 1,
   wherein a combined DC resistance component of the first DC resistance component and the second DC resistance component is set in the range of 0Ω to 7.5Ω inclusive.

7. The surge absorber according to claim 1,
wherein the first DC resistance component is constructed of the first internal conductor and wherein the second DC resistance component is constructed of the second internal conductor.

8. The surge absorber according to claim 7, wherein a combined DC resistance component of a DC resistance component of the first internal conductor and a DC resistance component of the second internal conductor is set in the range of 0Ω to 7.5Ω inclusive.

9. The surge absorber according to claim 1, further comprising a capacitor portion having a capacitance component connected between the first terminal electrode and the second terminal electrode.

10. The surge absorber according to claim 9, wherein the capacitance component of the capacitor portion is constructed of the first internal conductor and the second internal conductor.

11. The surge absorber according to claim 1,
wherein the first terminal electrode is an input terminal electrode,
wherein the second terminal electrode is an output terminal electrode, and
wherein the first internal conductor and the second internal conductor are positively coupled.

12. A surge absorber comprising:
a first terminal electrode;
a second terminal electrode;
a third terminal electrode;
an inductor portion having a first internal conductor and a second internal conductor mutually coupled in a polarity-reversed relation, wherein one end of the first internal conductor is connected to the first terminal electrode, one end of the second internal conductor is connected to the second terminal electrode, and an other end of the first internal conductor is connected to an other end of the second internal conductor;
a surge absorbing portion having a first internal electrode connected to the other end of the first internal conductor and to the other end of the second internal conductor, and a second internal electrode connected to the third terminal electrode; and
a resistor portion having a first DC resistance component connected between the first terminal electrode and the first internal electrode, and a second DC resistance component being larger than the first DC resistance component and connected between the first internal electrode and the second terminal electrode.

* * * * *